(12) United States Patent
Lee

(10) Patent No.: US 8,395,924 B2
(45) Date of Patent: Mar. 12, 2013

(54) NON-VOLATILE MEMORY DEVICE AND METHOD FOR PROGRAMMING THE SAME

(75) Inventor: Sung Yeon Lee, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 147 days.

(21) Appl. No.: 12/982,756

(22) Filed: Dec. 30, 2010

(65) Prior Publication Data

US 2012/0147655 A1 Jun. 14, 2012

(30) Foreign Application Priority Data

Dec. 8, 2010 (KR) .................... 10-2010-0124844

(51) Int. Cl.
*G11C 11/00* (2006.01)

(52) U.S. Cl. .................. 365/148; 365/158; 365/189.04; 365/171

(58) Field of Classification Search .................. 365/148, 365/158, 171, 189.04, 163
See application file for complete search history.

(56) References Cited

U.S. PATENT DOCUMENTS

| 8,107,284 B2 * | 1/2012 | Choi .......................... 365/163 |
| 8,159,867 B2 * | 4/2012 | Cho et al. .................. 365/163 |
| 8,199,603 B2 * | 6/2012 | Chung et al. .............. 365/230.06 |

* cited by examiner

*Primary Examiner* — David Lam

(57) ABSTRACT

A non-volatile memory device and a method for programming the same are disclosed. The method for programming the non-volatile memory device includes generating a simultaneous write current based on a program address in such a manner that bit line write cells corresponding to memory cells coupled to the same bit line from among memory cells to be programmed can be simultaneously programmed, and providing the simultaneous write current to the bit line write cells by simultaneously enabling the bit line write cells.

23 Claims, 13 Drawing Sheets

NON-VOLATILE MEMORY DEVICE AND METHOD FOR PROGRAMMING THE SAME

CROSS-REFERENCE TO RELATED APPLICATION

The priority of Korean patent application No. 10-2010-0124844 filed on Dec. 8, 2010, the disclosure of which is hereby incorporated in its entirety by reference, is claimed.

BACKGROUND OF THE INVENTION

Embodiments of the present invention relate to a method for programming a non-volatile memory device, and more particularly to a method for programming a non-volatile memory device that writes data using a current-driven scheme.

A non-volatile memory device which uses a resistance material includes a Phase Change Random Access Memory (PCRAM), a Resistive RAM (RRAM), and a Magnetic RAM (MRAM). A non-volatile memory device using a resistance material stores data by changing properties of the resistance material. For example, a PCRAM stores data based on phase change of a phase change material such as a chalcogenide alloy, an RRAM stores data based on variable resistance of a variable resistance material, an MRAM stores data using a Magnetic Tunnel Junction (MTJ) thin film depending on a magnetization status of a ferromagnetic substance, and the like, whereas data is stored in Dynamic RAM (DRAM) or flash memory is based upon electrical charges.

Therefore, the non-volatile memory device using such a resistance material stores data therein by applying different write currents or different write voltages, and identifies data based on current or voltage read from each memory cell.

BRIEF SUMMARY OF THE INVENTION

Various embodiments of the present invention are directed to providing a non-volatile memory device and a method for programming the same that substantially obviate one or more problems due to limitations and disadvantages of the related art.

An embodiment of the present invention provides a method for programming a non-volatile memory device to minimize a programming time by simultaneously programming several memory cells coupled to one input/output (I/O) circuit, and also provides the non-volatile memory device for use in the programming method.

Another embodiment of the present invention provides a method for programming a non-volatile memory device to write data in several memory cells by generating a simultaneous write current that is capable of simultaneously programming a plurality of memory cells, and also provides the non-volatile memory device for use in the programming method.

In accordance with one aspect of the present invention, a method for programming a non-volatile memory device includes generating a simultaneous write current for bit line write cells based on a program address in such a manner that the bit line write cells corresponding to memory cells coupled to the same bit line from among memory cells to be programmed can be simultaneously programmed based on the program address, and providing the simultaneous write current to the bit line write cells by simultaneously enabling the bit line write cells.

In accordance with another aspect of the present invention, a method for programming a non-volatile memory device includes calculating resistance values of bit line write cells based on a program address, wherein the bit line write cells correspond to memory cells coupled to the same global bit line from among memory cells to be programmed, generating a simultaneous write current for programming the bit line write cells based on the calculated resistance values, and providing the simultaneous write current to the bit line write cells by simultaneously enabling the bit line write cells.

In accordance with another aspect of the present invention, a method for programming a non-volatile memory device including a non-volatile memory cell array that includes a plurality of bit lines and a plurality of word lines includes calculating resistance values of bit line write cells corresponding to memory cells to be programmed and coupled to a single bit line from among the plurality of bit lines, generating a simultaneous write current based on the calculated resistance values of the bit line write cells and a driving voltage, and enabling the word lines coupled to the bit line write cells, and providing the simultaneous write current to the enabled word lines.

In accordance with another aspect of the present invention, a non-volatile memory device includes a controller may generate a program address and an I/O control signal by communicating with an external part, a memory cell array may include a plurality of memory cells, each of which is coupled to a plurality of bit lines and a plurality of word lines, wherein accessing of the memory cells is achieved based on the program address, an I/O unit may include I/O circuits from among bit line cells corresponding to the memory cells coupled to one of the bit lines, wherein the I/O circuits generate a simultaneous write current in such a manner that a program operation can be simultaneously performed based on the program address, and a row decoder may be coupled to each word line of the memory cell array, and enable write partitions including the bit line write cells in such a manner that the simultaneous write current can be simultaneously provided to the bit line cells based on the program address.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

It is to be understood that the detailed description which will be disclosed along with the accompanying drawings is intended to describe the embodiments of the present invention, and is not intended to describe a unique embodiment through which the present invention can be carried out. Hereinafter, the detailed description includes detailed matters to provide full understanding of the present invention. However, it will be apparent to those skilled in the art that the present invention can be carried out without such detailed matters. In some instances, well-known structures and devices are omitted in order to avoid obscuring the concepts of the present invention and the important functions of the structures and devices are shown in block diagram form.

Figure 1:
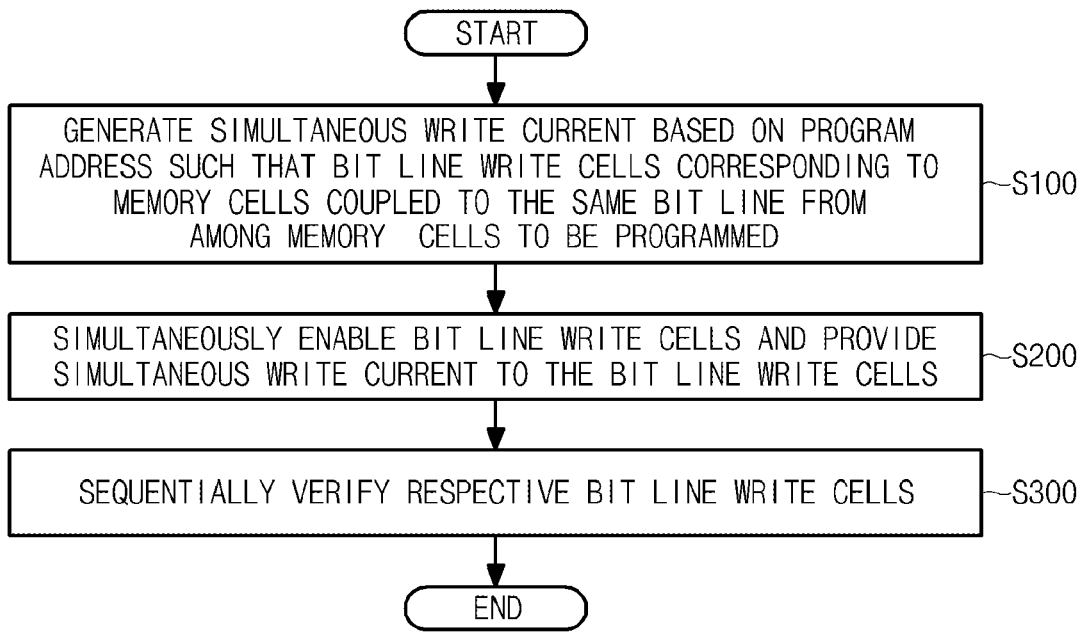
FIG. 1 is a flowchart illustrating a method for programming a non-volatile memory device according to an embodiment of the present invention.

FIG. 1 is a flowchart illustrating a method for programming a non-volatile memory device according to an embodiment of the present invention.

Referring to FIG. 1, the programming method for use in the non-volatile memory device can generate a simultaneous write current based on a program address, such that it can simultaneously program bit line write cells corresponding to memory cells coupled to the same bit line from among memory cells to be programmed at step S100.

The program addresses may correspond to addresses of memory cells which are carrying out a program operation, and include a row address and a column address. A memory cell array of the non-volatile memory device includes a plurality of word lines and a plurality of bit lines, and memory cells which are coupled to the intersection between the bit lines and the word lines, so that a specific memory cell can be selected based on a row address and column address.

In accordance with an embodiment of the present invention, a write driver and a sense amplifier for performing the program operation of the memory cell array may be coupled to a local bit line or a global bit line. In the following description, the write driver and the sense amplifier will be described as an I/O circuit.

The I/O circuit is coupled to a global bit line or a local bit line so as to provide a write current. When the I/O circuit is coupled to the local bit line, the write current may be provided to memory cells coupled to one local bit line. Otherwise, when the I/O circuit is coupled to the global bit line, the write current provided through the global bit line may be provided to the same local bit line through a column selection switch.

Therefore, the I/O circuit coupled to the global bit line may provide the write current to memory cells coupled to a plurality of local bit lines.

In accordance with an embodiment of the present invention, bit line write cells may indicate memory cells to be programmed from among memory cells that are coupled to one I/O circuit to provide a write current. As used herein, a "simultaneous write current" refers to a write current that is provided substantially simultaneously to a plurality of bit line write cells such that a program operation of the bit line write cells can be performed during the same program operation. The bit line write cell and the simultaneous write current will hereinafter be described with reference to FIGS. 3A and 3B.

The bit line write cells are simultaneously enabled to be provided with a simultaneous write current at step S200. In order to enable the bit line write cells, a word line coupled to the bit line write cells is enabled to, e.g., a logic low state, so that the simultaneous write current can be provided to the bit line write cells through local bit lines where the bit line write cells are coupled to. In accordance with an embodiment of the present invention, when the I/O circuit is coupled to the global bit line, the word line is enabled, and at the same time a path directed to a bit line is provided through a local column decoder, thereby providing the simultaneous write current.

In the method for programming the non-volatile memory device according to this embodiment of the present invention, individual bit line cells have been programmed by the simultaneous write current so that the respective bit line cells can be sequentially verified at step S300. As described above, the simultaneous write current is provided to several bit line write cells at substantially the same time, such that processes for storing data in the individual memory cells can be simultaneously carried out. In addition, data written in the individual bit line write cells may be sequentially verified.

The sequential verification process of the individual bit line write cells may be implemented by providing a read current to one of the bit line write cells, detecting a bit line voltage and comparing a sense output signal generated based on the bit line voltage with write data that is intended to be written.

When the sense output signal is identical to the write data, the corresponding bit line write cell may be determined to be a passed memory cell. Otherwise, when the sense output signal is different from the write data, the corresponding bit line write cell may be determined to be a failed memory cell. If necessary, an additional programming process may be required for the failed memory cells. The programming method of the non-volatile memory device according to this embodiment of the present invention may store verification data corresponding to the several bit line write cells coupled to one I/O circuit in which a program operation is performed.

When at least one bit line write cell from among bit line write cells is determined to be a failed memory cell, each failed memory cell is set as a bit line write cell in a subsequent step so that the program operation thereof may be repeatedly carried out. The program operation may be repeated until all bit line write cells have passed.

Figure 2:
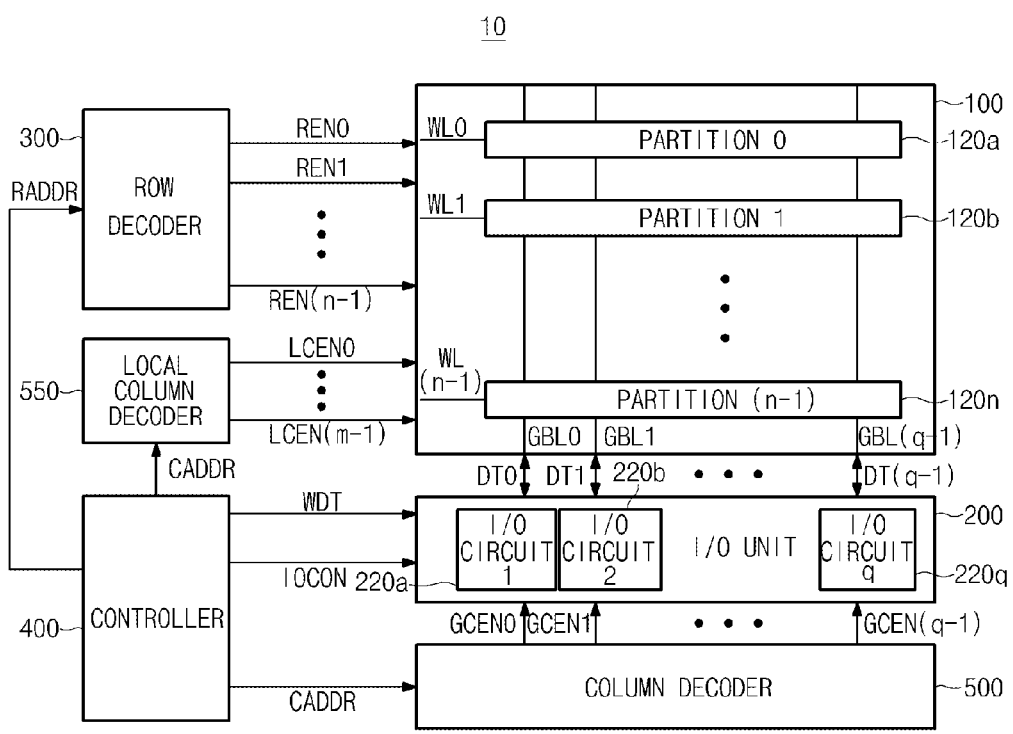
FIG. 2 is a block diagram illustrating a non-volatile memory device for executing the programming method according to an embodiment of the present invention.

FIG. 2 is a block diagram illustrating a non-volatile memory device for executing the programming method according to an embodiment of the present invention.

Referring to FIG. 2, the non-volatile memory device 10 may include a memory cell array 100, an I/O unit 200, a row decoder 300, a column decoder 500, and a local column decoder 550.

The memory cell array 100 may include a plurality of word lines, a plurality of bit lines, and a plurality of memory cells respectively coupled to the word lines and the bit lines. The plurality of memory cells may include a plurality of resistive memory cells. Each resistive memory cell may operate as a variable resistive element that has a resistance value set according to a write current. Each of the memory cells may operate as a variable resistive element that has a different resistance value according to a variation in resistance of any of a PCRAM formed of a phase change material such as a chalcogenide alloy, an RRAM formed of a variable resistance material, an MRAM formed of a Magnetic Tunnel Junction (MTJ) thin film depending on a magnetization status of a ferromagnetic substance, or the like.

Assuming that a read current is applied during reading or verifying operations, different voltage levels are formed in a bit line coupled to resistive memory cells according to resistance values of the resistive memory cells. As a result, a voltage level of the bit line is detected such that data written in each resistive memory cell can be detected.

For example, assuming that the memory cell array 100 includes phase change memory cells, the phase change memory cells are controlled according to an amorphous/crystalline state during a write operation, such that, during the write operation, each phase change memory cell may have a resistance value higher than a previous resistance value acquired prior to the reading operation.

The memory cell array 100 may include a plurality of partitions 120a, 120b, ..., and 120n that are coupled to a plurality of word lines WL0, WL1, ..., WL (n−1), respectively. The partitions 120a, 120b, ..., and 120n may include a plurality of memory cells sharing the word lines WL0, WL1, ..., WL (n−1). The memory cell array 100 receives row enable signals REN0, REN1, ..., and REN (n−1) corresponding to the number of word lines WL0, WL1, ..., WL (n−1) from the row decoder 300, which enables the word lines WL0, WL1, ..., and WL (n−1). The enabling of the word line according to an embodiment of the present invention may provide a write voltage, a verification voltage, or a read voltage to the word line so as to drive memory cells coupled to the word line. Therefore, the row enable signals REN0, REN1, ..., and REN (n−1) for enabling the word line WL0, WL1, ..., WL (n−1) may differ according to memory cell array structures. In accordance with an embodiment of the present invention, the write voltage may be a voltage corresponding to a ground voltage.

The memory cell array 100 receives global column enable signals GCEN0, GCEN1, ..., and GCEN (q−1) from the column decoder 500, receives local column enable signals LCEN0, ..., and LCEN (m−1) from the local column decoder 550, and thus selectively enables the bit lines. Herein, n and m are positive integers. The enabling of the bit line according to an embodiment of the present invention may indicate that a bit line path is enabled using a switch and the like coupled to the bit line. When the bit line is enabled, data may be written in a memory cell corresponding to an enabled path of the bit line contained in the memory cell array 100, or data may be read from the memory cell.

In accordance with an embodiment of the present invention, the global column enable signals GCEN0, GCEN1, ..., and GCEN (q−1) are respectively provided to the global bit lines GBL0, GBL1, ..., and GBL (q−1) of the memory cell array 100, so that the global bit line can be enabled. A plurality of local bit lines (not shown) respectively coupled to the global bit lines GBL0, GBL1, ..., and GBL (q−1) may write or read data in or from a specific memory cell through an electric path of a bit line formed based on both the global column enable signal GCEN and the local column enable signal LCEN.

The I/O unit 200 may include a plurality of I/O circuits 220a, 220b, ..., and 220q respectively coupled to the global bit lines GBL0, GBL1, ..., and GBL (q−1) of the memory cell array 100. During the program operation, the plurality of I/O circuits 220a, 220b, ..., and 220q may receive an I/O control signal IOCON and write data WDT. The I/O control signal IOCON may be provided from an external device such as a host, or may be provided from a controller 400 that may be contained in the non-volatile memory device 10. The I/O control signal IOCON may include operation mode information that enables the non-volatile memory device 10 to perform at least one of a write operation, a verification operation, a read operation, and a deletion operation. Therefore, during the program operation, the I/O control signal IOCON may allow the I/O unit 200 to perform a write operation and a verification operation contained in the program operation of the I/O unit 200. The I/O circuit 200 may serve as a write driver in each of the write operation and the deletion operation, or may also serve as a sense amplifier for the verification and read operations. The I/O unit 200 transmits data DT0, DT1, ..., DT (q−1) to the memory cell array 100 dependent upon the operation modes.

In addition, according to an embodiment of the present invention, the I/O unit 200 may be coupled to the global bit line GBL or the bit line BL. An embodiment of the present invention may use the term 'bit line BL' together with the other term 'global bit line GBL' as necessary, and a combination of the two terms may also be used as necessary. However, assuming that individual bit lines (BLs) coupled to the global bit line GBL are identified and indicated, the term 'local bit line' may be additionally used.

The write data WDT may include data to be written in each memory cell. In accordance with an embodiment of the present invention, assuming that 1 bit is written in each memory cell contained in the memory cell array 100, it is determined that the write data WDT may have the same bit as the 1-bit data, and thus the write data WDT may not be provided. For example, provided that data of logic '1' is given to the program state and data of logic '0' is given to the deletion state, additional write data WDT other than the program addresses indicating addresses of memory cells to be programmed is not required.

For example, the non-volatile memory device 10 according to an embodiment of the present invention can simultaneously program several memory cells from among memory cells coupled to the global bit line GBL. For example, since one I/O circuit 220 is coupled to the global bit line GBL, so as to perform the program operation, a single memory cell coupled to the global bit line GBL may be programmed at the same time point. However, assuming that the program operation of the single memory cell is performed, the program operation is sequentially applied to one memory cell, so that the time required for the program operation is increased, resulting in a reduction in the operation speed of the non-volatile memory device 10. When each of the memory cells is a resistive memory cell, the time required for the write operation is relatively long. However, if the write operation is simultaneously applied to several memory cells, this result in a reduction in time required for the program operation.

Therefore, the non-volatile memory device 10 according to an embodiment of the present invention enables bit line write cells to be programmed based on a program address from among a plurality of memory cells coupled to the same bit line, and performs the program operation at the same time, resulting in a reduction in time required for the program operation. As described above, several memory cells coupled to the same bit line may be contained in different partitions, such that it can be recognized that several partitions contained in the memory cell array 100 are simultaneously enabled when the program operation is performed. In more detail, a write current is simultaneously provided to the several memory cells, the write operation is then performed on the individual memory cells followed by the verification operation of the individual memory cells. During the verification operation, since different currents of individual memory cells in which the write operation is performed can be detected, the individual memory cells may be sequentially verified.

The column decoder 500 receives a column address signal CADDR, so that it can generate the global column enable signals GCEN0, GCEN1, ..., and GCEN (q−1). The local column decoder 550 receives the column address signal CADDR so that it can generate the local column enable signals LCEN0, ..., and LCEN (m−1). Although the local column decoder 550 and the column decoder 500 are separated from each other in FIG. 2, the scope or spirit of the present invention is not limited thereto, and the local column decoder 550 may be contained in the column decoder 500.

The row decoder 300 receives a row address signal RADDR so that it may generate the row enable signals REN0, REN1, ..., and REN (n−1).

In accordance with an embodiment of the present invention, the non-volatile memory device 10 may further include a controller 400 for generating a program address including the row address RADDR and the column address signal CADDR that are provided to the row decoder 300, and the column decoder 500 and the local column decoder 550, respectively.

The controller 400 receives signals required for operating the non-volatile memory device 10 by communicating with an external device such as a host, generates the I/O control signal IOCON, the column address signal CADDR and the row address signal RADDR to constituent elements contained in the non-volatile memory device 10. Accordingly, the controller 400 may control the operation of the non-volatile memory device 10.

Figure 3A:
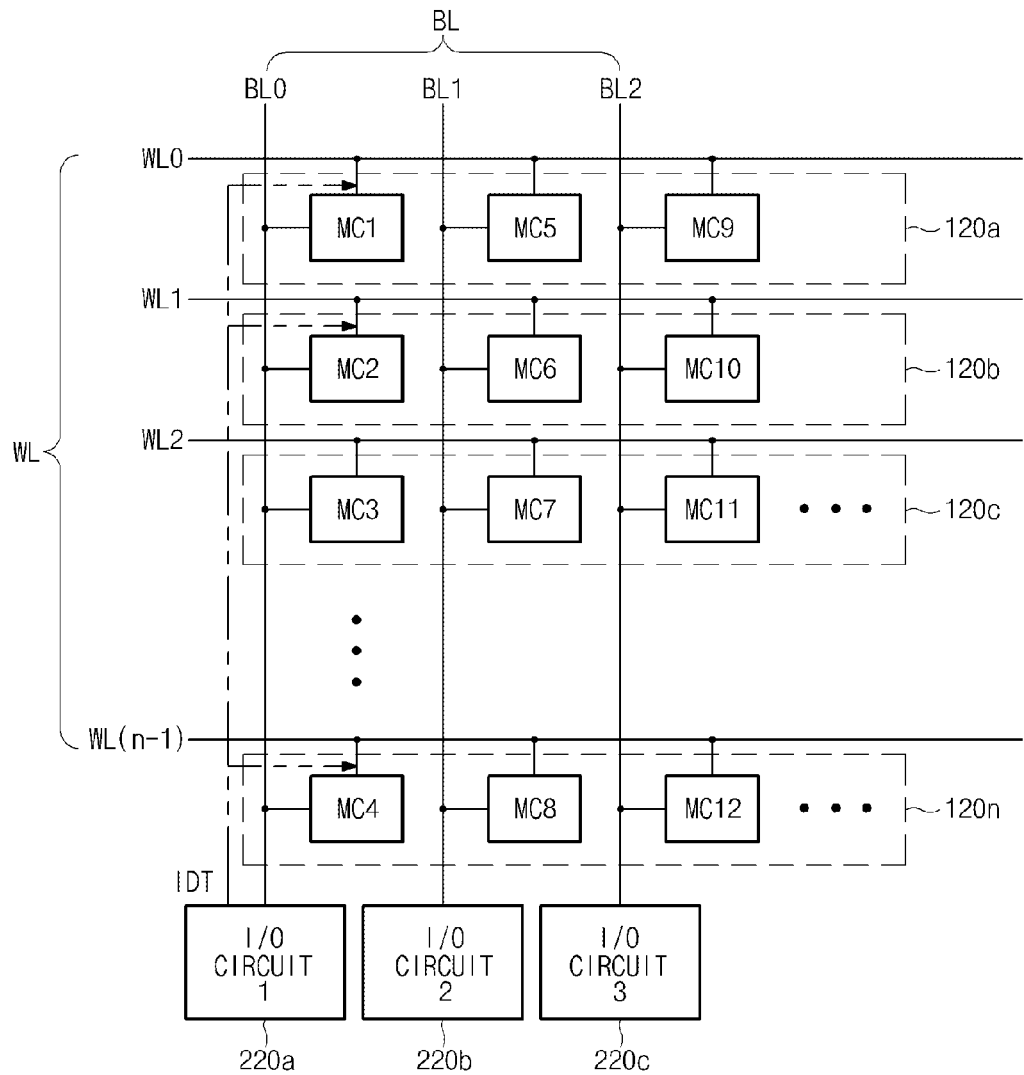
FIGS. 3A and 3B are conceptual diagrams illustrating programming methods of the non-volatile memory device according to an embodiment of the present invention.
Figure 3B:
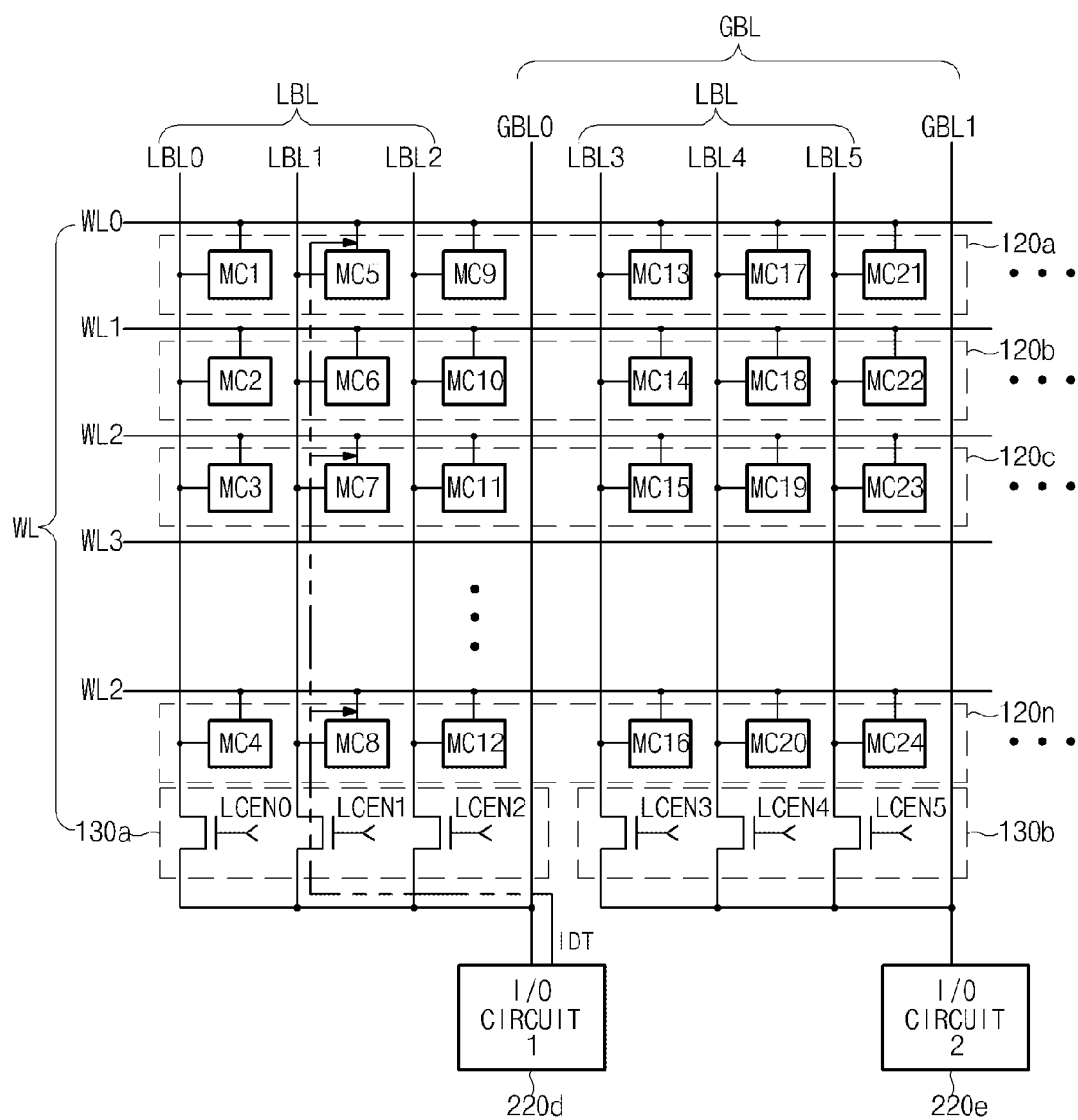

FIGS. 3A and 3B are conceptual diagrams illustrating programming methods of a non-volatile memory device according to an embodiment of the present invention. A bit line write cell, a simultaneous write current, partition names, and the method for programming the non-volatile memory device according to an embodiment of the present invention will be described with reference to FIGS. 3A and 3B.

Referring to FIG. 3A, the non-volatile memory device may include a plurality of I/O circuits 220a, 220b, and 220c coupled to a plurality of bit lines BL0, BL1, and BL2, and a plurality of memory cells MC1, MC2, ..., MC11, and MC12 coupled to a plurality of word lines WL0, WL1, WL2, ..., and WL (n−1) crossing the bit lines BL0, BL1, and BL2.

Although a limited number of I/O circuits, bit lines, word lines, and memory cells are shown in FIG. 3A, these configurations are disclosed for illustrative purposes only, and the scope or spirit of the present invention is not limited thereto and can be applied to other examples as necessary.

Memory cells MC1, MC2, ..., MC11, and MC12 sharing the word lines WL0, WL1, WL2, ..., and WL (n−1) construct individual partitions 120a, 120b, 120c, ..., and 120n. For example, the first partition 120a may include first, fifth, and ninth memory cells MC1, MC5, and MC9, and the third partition 120c may include third, seventh, and eleventh memory cells MC3, MC7, and MC11. Several memory cells contained in the individual partitions 120a, 120b, 120c, ..., and 120n are enabled by the corresponding word lines WL0, WL1, WL2, ..., and WL (n−1), and thus receive current signals from the bit lines BL0, BL1, and BL2.

The operation of the first I/O circuit 220a will hereinafter be described as an example. Memory cells, which are to be programmed by a program address, are selected from among several memory cells MC1, MC2, MC3, and MC4 coupled to the first bit line BL0 coupled to the first I/O circuit 220a. In the present invention, memory cells to be programmed from among several memory cells coupled to the same bit line are referred to as bit line write cells. For example, assuming that the first, second, and fourth memory cells MC1, MC2, and MC4 are bit line write cells, the I/O circuit 220a provides a simultaneous write current IDT through the first bit line BL0. The simultaneous write current IDT may represent a write current that is provided from the first I/O circuit 220a and then provided to the bit line write cells at the same time.

The simultaneous write current IDT may be generated in the first I/O circuit 220a and then provided to the first bit line BL0. In accordance with an embodiment of the present invention, the magnitude of the simultaneous write current IDT may be restricted by a driving voltage provided to the first I/O circuit 220a. That is, the maximum simultaneous write current IDT that can be generated may be restricted based on the driving voltage.

In the case where the non-volatile memory device according to an embodiment of the present invention includes a plurality of resistive memory cells, the simultaneous write current may be decided depending upon resistance values of the bit line write cells. The calculation of the detailed magnitude of the simultaneous write current will be described later.

Although the simultaneous write current IDT is provided through the first bit line BL0 which is connected to the memory cells MC1 through MC4, when the word lines corresponding to the memory cells MC1 through MC4 are disabled, i.e., when the partitions corresponding to the memory cells MC1 through MC4 are disabled, the simultaneous write current IDT is not provided to the memory cells MC1 through MC4. As described above, in order to enable the first, second, and fourth memory cells MC1, MC2, and MC4 to which the simultaneous write current IDT is to be provided through the first I/O circuit 220a, the first partition 120a is enabled by enabling the first word line WL0, the second partition 120b is enabled by enabling the second word line WL1, and the N-th partition 120n is enabled by enabling the N-th word line WL (n−1). Since the third word line WL2 is disabled to disable the third partition 120c, the simultaneous write current IDT is not provided to the third memory cell MC3 although the simultaneous write current IDT is provided through the first bit line BL0.

FIG. 3B is a structural view illustrating how several I/O circuits, e.g., 220d and 220e, are coupled to several global bit lines, e.g., GBL0 and GBL1. As compared with FIG. 3A, since the global bit lines GBL0 and GBL1 may be coupled to local bit lines LBL0, LBL1, ..., and LBL5, the I/O circuits 220d and 220e shown in FIG. 3B are coupled to a memory cell through the global bit lines GBL0 and GBL1 and the local bit lines LBL0, LBL1, ..., and LBL5, whereas the I/O circuits 220a, 220b, and 220c shown in FIG. 3A are coupled to individual memory cells through only one bit line BL.

For example, the simultaneous write current IDT provided through the first I/O circuit 220d may be provided to fifth, seventh, and eighth memory cells MC5, MC7, and MC8 through the first global bit line GBL0 and the second local bit line LBL1. The global bit lines GBL0 and GBL1 and the local bit lines LBL0, LBL1, ..., and LBL5 may be electrically interconnected by column selection units 130a and 130b each including a plurality of column selection switches. In response to the local column enable signal LCEN0, LCEN1, ..., and LCEN5 shown in FIG. 2, the column selection units 130a and 130b may couple the global bit lines GBL0 and GBL1 to the local bit lines LBL0, LBL1, ..., and LBL5.

The I/O circuits 220d and 220e shown in FIG. 3B are respectively coupled to the global bit lines GBL0 and GBL1 coupled to the local bit lines LBL0, LBL1, ..., and LBL5, so that the number of memory cells per I/O circuit, may be higher than that of each of the I/O circuits 220a, 220b, and 220c shown in FIG. 3A. For example, the first I/O circuit 220d may provide the simultaneous write current IDT to the first to twelfth memory cells MC1, MC2, ..., MC11, and MC12, and the second I/O circuit 220e may provide the simultaneous write current IDT to the $13^{th}$ to $24^{th}$ memory cells MC13, MC14, ..., MC23, and MC24. However, in this case, it is impossible to simultaneously enable memory cells belonging to one I/O circuit but contained in one partition 120a, 120b, 120c, ..., or 120n. For example, in the case where the second word line WL1 is enabled and the second partition 120b is thus enabled, it is possible to provide the simultaneous write current IDT to only one memory cell from among the second memory cell MC2, the sixth memory cell MC6, and the $10^{th}$ memory cell MC10.

Figure 4:
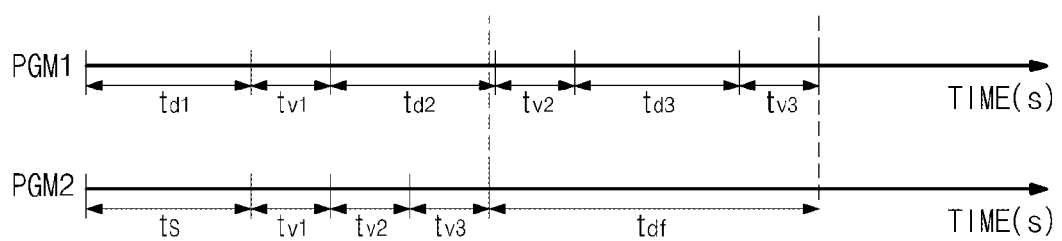
FIG. 4 is a diagram illustrating a time required for the programming method of the non-volatile memory device according to an embodiment of the present invention.

FIG. 4 shows a time required for the programming method of the non-volatile memory device according to an embodiment of the present invention.

Referring to FIG. 4, a first program method PGM1 and a second program method PGM2 are compared with each other, and the comparison result will hereinafter be described in detail. In the case of the first program method PGM1, the I/O circuit 220 performs the program operation and the verification operation of a single memory cell. In the case of the second program method PGM2, the program operation for a plurality of memory cells is performed and each memory cell is then verified. FIG. 4 shows a method for performing the program operation and the verification operation of three memory cells.

In the case of the first program method PGM1, a write current is provided to a first memory cell during a first data write time td1 so that a resistance value of the memory cell is changed. Thereafter, data written in the first memory cell is read during a first verification time tv1 so as to verify the written data. For convenience of description and better understanding of the present invention, the present invention assumes that desired data is written in the first memory cell. In accordance with an embodiment of the present invention, the first data write time td1 during which data is written in the first memory cell may be longer than the first verification time tv1. That is, when the resistance value of a memory cell is changed to store data, the data writing time may be longer than the verification time due to the variation of a memory cell state.

In the same manner as described above, the write current is provided to the second memory cell, so that a resistance value of the second memory cell is changed during a second data write time td2 and verification of data is achieved in a second verification time tv2. The write current is provided to a third memory cell, so that a resistance value of the third memory cell is changed during a third data write time td3. In addition, a resistance value of the third memory cell is read so that data verification is achieved in a third verification time tv3.

In the case of the second program method PGM2, as described above, the simultaneous write current is provided to several bit line write cells to be programmed from among memory cells coupled to the single I/O circuit 220 through the bit line BL or the global bit line GBL, such that data can be simultaneously written in the several bit line write cells.

Referring to FIG. 4, the simultaneous write current is provided to the first to third memory cells during a simultaneous data write time ts, such that resistance values of the first to third memory cells are changed. In accordance with an embodiment of the present invention, the simultaneous data write time ts may be substantially identical to each of the first to third data write times td1, td2, and td3 for use in the first program method PGM1. The first to third memory cells may be sequentially verified. Accordingly, data of the first memory cell is verified for the first verification time tv1. During the second verification time tv2, data of the second memory cell is verified. During the third verification time tv3, data of the third memory cell is verified. Each of the first to third verification times tv1, tv2, and tv3 may be substantially identical to that in the first program method PGM1. However, in the case of the second program method PGM2, the data writing operation which is relatively longer than the verification operation, is simultaneously performed, thereby reducing the program time by a predetermined time tdf.

Figure 5:
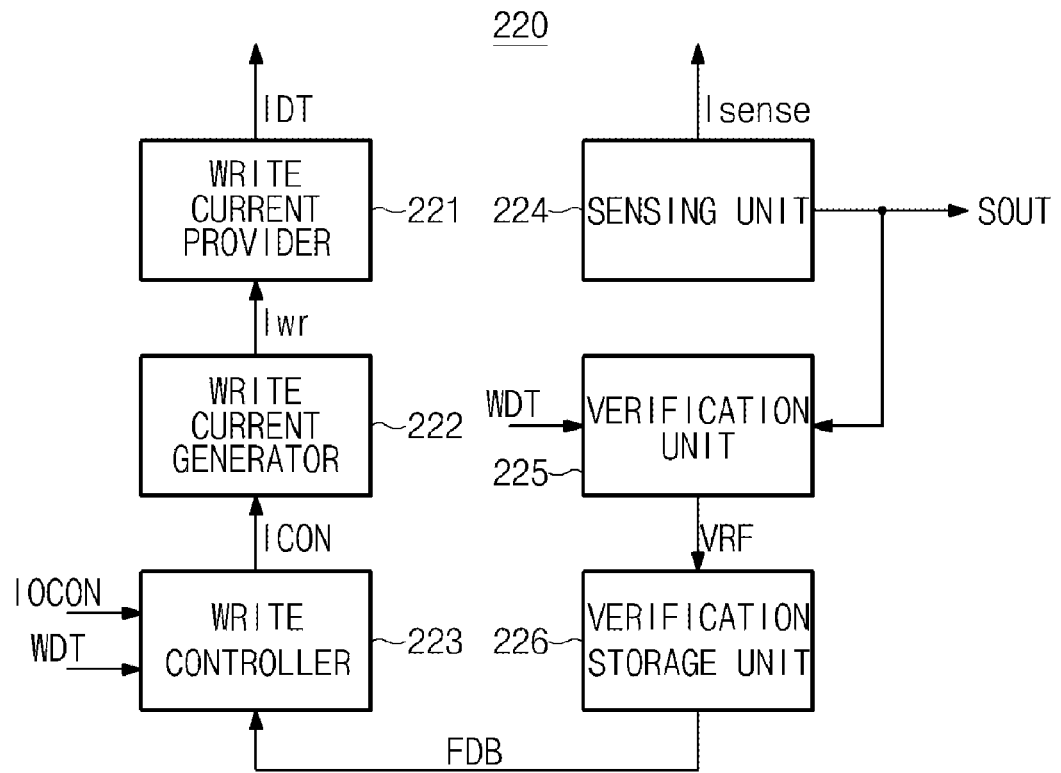
FIG. 5 is a block diagram illustrating an input/output (I/O) circuit according to an embodiment of the present invention.

FIG. 5 is a block diagram illustrating the I/O circuit according to an embodiment of the present invention.

Herein, the I/O circuit 220 may include each of the I/O circuits 220a, 220b, 220c, 220d, and 220e shown in FIGS. 2, 3A and 3B.

Referring to FIG. 5, the I/O circuit 220 may include a write current provider 221, a write current generator 222, a write controller 223, a sensing unit 224, a verification unit 225, and a verification storage unit 226.

The write current provider 221 may provide the simultaneous write current IDT to the bit line BL. The write current provider 221 may be enabled according to an operation mode of the non-volatile memory device 10. For example, the write current provider 221 may be enabled during the program operation and the deletion operation, and may be disabled during the read operation.

The write current generator 222 may provide a write current Iwr based on a current control signal ICON. The write current Iwr may be substantially identical to the simultaneous write current IDT. The write current Iwr may have different values according to the number of bit line write cells, a resistance value of each memory cell, and a saturation state of a driving transistor of the write current provider 221.

The write controller 223 receives the I/O control signal IOCON and the write data WDT from the controller 400 shown in FIG. 2, such that it can generate the current control signal ICON. The write controller 223 identifies bit line write cells based on the program address contained in the I/O control signal IOCON, and recognizes data to be written in each bit line write cell, such that it can enable the write current generator 222 to generate the write current Iwr.

In addition, the write controller 223 receives a verification feedback signal FDB from the verification storage unit 226 in response to the verification result, so that the program operation can be repeatedly performed. The verification feedback signal FDB may include information about failed memory cells from among previous bit line write cells.

The write current provider 221, the write current generator 222, and the write controller 223 may operate as a write driver.

The sensing unit 224 sequentially provides a read current Isense to bit line write cells each including data, so that it can detect a voltage level of the bit line BL. Each bit line write cell including data therein may have different resistance values, such that the bit line BL may have different voltage levels according to the read current Isense. The voltage level of the bit line BL is compared with a predetermined reference voltage, such that it can be used as a sense output signal SOUT. When the non-volatile memory device 10 performs the read operation, the sense output signal SOUT may be output to an external part. When the non-volatile memory device 10 performs the verification operation from among the program methods, the sense output signal SOUT may be provided to the verification unit 225.

The verification unit 225 compares the sense output signal SOUT with the write data WDT, determines whether the desired data was written in the bit line write cell, and then generates verification result data VRF according to the determined result. In the method for programming the non-volatile memory device 10 according to an embodiment of the present invention, since the verification operation is sequentially performed on the bit line write cells, the verification result data VRF may be generated in individual memory cells. The verification result data VRF may include addresses of the bit line write cells and information about whether the bit line write cells have passed or failed.

The verification storage unit 226 stores the verification result data VRF, so that it can generate the verification feedback signal FDB. In accordance with an embodiment of the present invention, when at least one bit line write cell is determined to have failed based on the verification result data VRF, the program operation can be repeatedly performed. As the write and read operations are repeated, data can be correctly written, and a read margin is guaranteed, such that the non-volatile memory device 10 can be reliably operated.

The sensing unit 224, the verification unit 225, and the verification storage unit 226 may operate as a sense amplifier.

Figure 6:
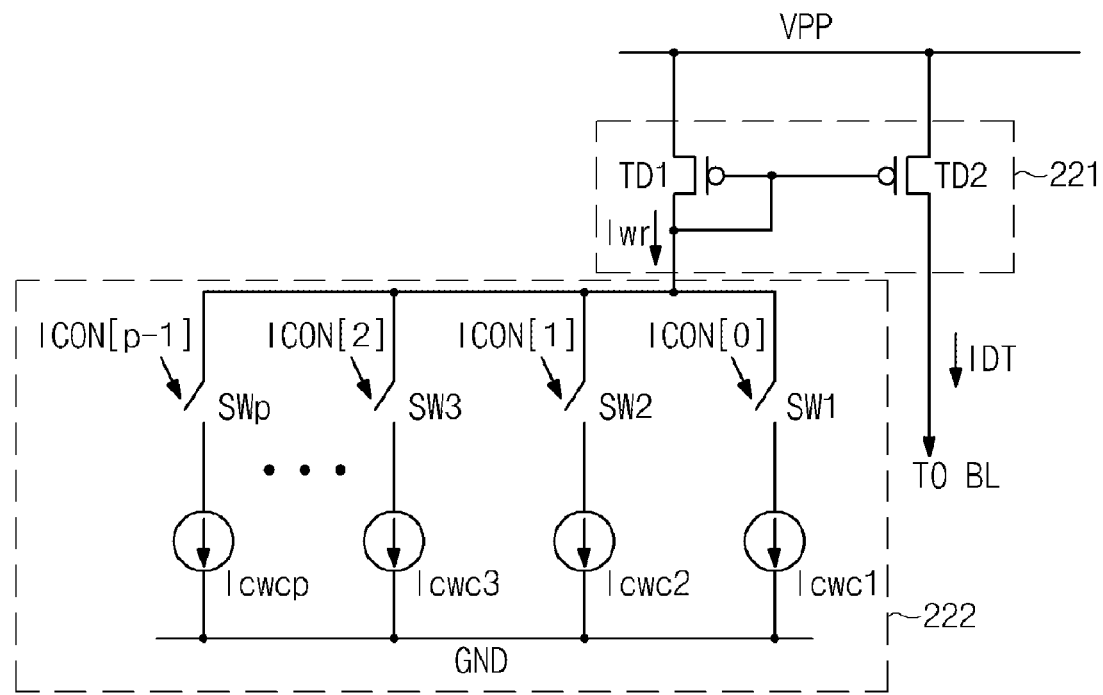
FIG. 6 is a circuit diagram illustrating a write current provider and a write current generator shown in FIG. 5 according to an embodiment of the present invention.

FIG. 6 is a circuit diagram illustrating the write current provider 221 and the write current generator 222 shown in FIG. 5 according to an embodiment of the present invention.

Referring to FIG. 6, the write current provider 221 may include a first driving transistor TD1 and a second driving transistor TD2.

The write current generator 222 may include a plurality of constant current sources Icwc1, Icwc2, Icwc3, . . . , and Icwcp and a plurality of switches SW1, SW2, SW3, . . . , and SWp coupled in series to the constant current sources Icwc1, Icwc2, Icwc3, . . . , and Icwcp, respectively, wherein p is a positive integer.

The first driving transistor TD1 may be coupled between a step-up voltage VPP and one terminal of the write current generator 222. The second driving transistor TD2 may be coupled between the step-up voltage VPP and the bit line BL. The first driving transistor TD1 and the second driving transistor TD2 are interconnected in the form of a current mirror.

The constant current sources Icwc1, Icwc2, Icwc3, . . . , and Icwcp may generate write currents that are substantially identical to each other. When the individual constant current sources Icwc1, Icwc2, Icwc3, . . . , and Icwcp generate the write currents substantially identical to each other, the constant current sources Icwc1, Icwc2, Icwc3, . . . , and Icwcp proportional to the number of bit line write cells may be provided with a write current Iwr because an electrical path is formed by switches SW1, SW2, SW3, . . . , and SWp.

In accordance with another embodiment of the present invention, the constant current sources Icwc1, Icwc2, Icwc3, . . . , and Icwcp may generate increasing write currents. For example, the second constant current source Icwc2 has a current value corresponding to two times the first constant current source Icwc1, the third constant current source Icwc3 has a current value corresponding to either two times the second constant current source Icwc2 or four times the first constant current source Icwc1.

The current control signal ICON selectively enables different switches SW1, SW2, SW3, . . . , and SWp according to resistance values of bit line write cells, so that it can provide the write current Iwr. For example, the current control signal ICON may be a digital signal, and may control the operations of the switches SW1, SW2, SW3, . . . , and SWp according to corresponding bits of the current control signals ICON[0], ICON[1], ICON[2], . . . , and ICON[p−1].

The write current Iwr may be provided to the write current provider 221 based on the current control signal ICON. In more detail, the write current Iwr may be provided to a first terminal of the first driving transistor TD1. A second terminal of the first driving transistor TD1 receives the step-up voltage VPP as an input such that the first driving transistor TD1 can be driven by the step-up voltage VPP. The second driving transistor TD2 and the first driving transistor TD1 may be interconnected in the form of a current mirror. The second driving transistor TD2 may provide a simultaneous write current IDT substantially identical to the write current Iwr through a first terminal. The simultaneous write current IDT may be provided to the bit line BL so that it can be provided to a plurality of bit line write cells.

Figure 7:
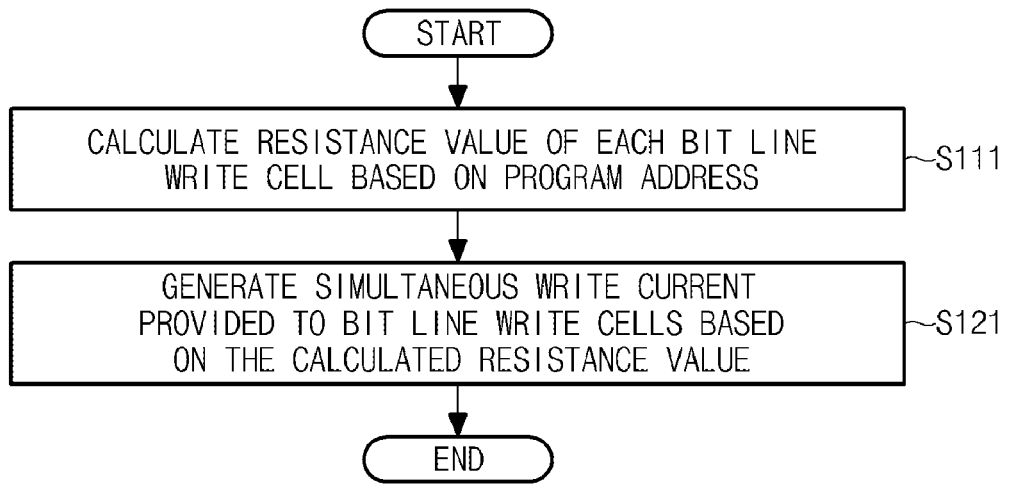
FIG. 7 is a flowchart illustrating a method for generating a simultaneous write current for bit line write cells according to an embodiment of the present invention.

FIG. 7 is a flowchart illustrating a method for generating a simultaneous write current for bit line write cells using the program method of the non-volatile memory device shown in FIG. 1.

Referring to FIG. 7, the write controller 223 shown in FIG. 5 may calculate resistance values of the bit line write cells based on the program address contained in the I/O control signal IOCON at step S111. The resistance values of the bit line write cells may have different values according to programmed data. For example, when specific data is written in bit line write cells, individual resistance values of the bit line write cells can be decided.

In accordance with an embodiment of the present invention, resistance values of individual bit line write cells may have substantially identical values, and the overall resistance value of the bit line write cells coupled to the bit line may be calculated by the parallel sum of the resistance values of the individual bit line write cells.

A simultaneous write current may be generated based on the calculated resistance value at step S121. For example, in the case where several constant current sources contained in the write current generator 222 generate write currents having substantially identical current values, a constant current source proportional to resistance values of the bit line write cells is enabled such that the simultaneous write current IDT can be generated. The relationship between a resistance value of each bit line write cell and the simultaneous write current IDT will hereinafter be described with reference to FIG. 10.

In accordance with another embodiment of the present invention, in the case where several constant current sources contained in the write current generator 222 generate a write current having different current values, different current control signals ICON are generated to form the simultaneous write current IDT.

Figure 8:
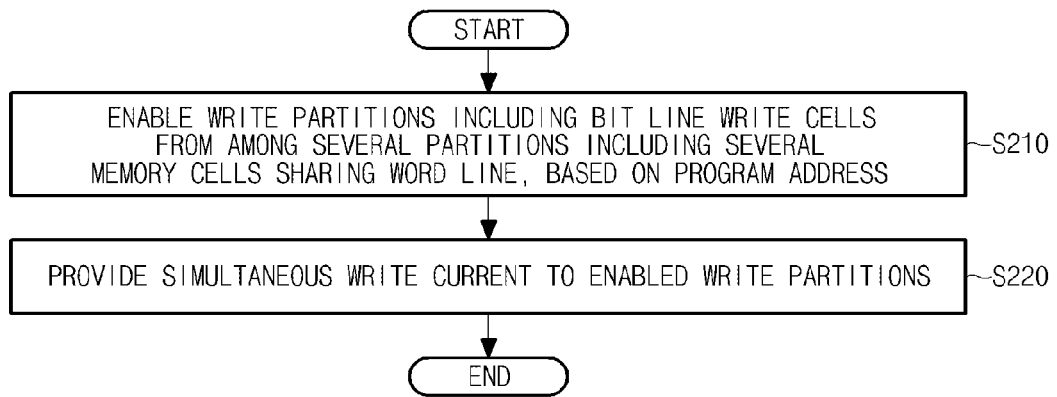
FIGS. 8 and 9 are flowcharts illustrating some methods for providing a simultaneous write current to a plurality of bit line write cells according to embodiments of the present invention.

FIG. 8 is a flowchart illustrating a method for generating a simultaneous write current for bit line write cells using the program method of the non-volatile memory device according to an embodiment of the present invention.

Referring to FIG. 8, write partitions including the bit line write cells from among several partitions each of which includes several memory cells sharing a word line can be enabled at step S210. As previously stated in FIGS. 3A and 3B, each partition may include a plurality of memory cells sharing a word line. In addition, for convenience of description and better understanding of the present invention, each partition including bit line write cells is referred to as a write partition.

In order to provide the simultaneous write current IDT to the bit line write cells, it is necessary to simultaneously enable the write partitions such that a current path via which the simultaneous write current IDT is provided can be formed. Therefore, word lines coupled to the bit line write cells can be enabled.

The simultaneous write current IDT can be provided to the enabled write partitions at step S220. As the simultaneous write current IDT is provided to the write partitions, a part of the simultaneous write current IDT are provided to each of the bit line write cells such that data can be written in the bit line write cells.

Figure 9:
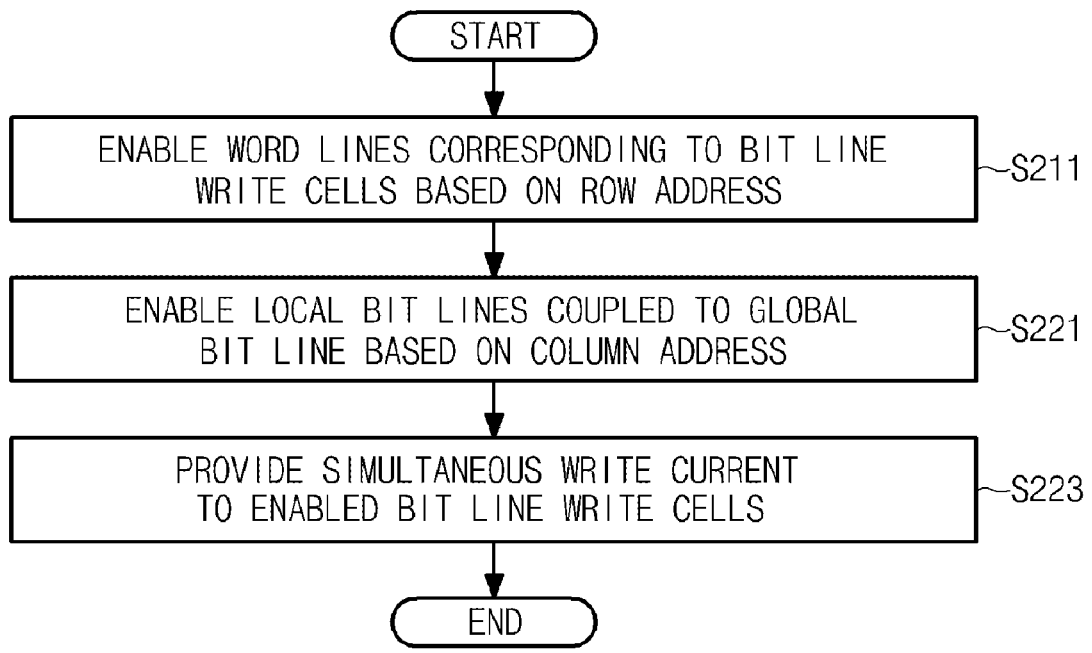

FIG. 9 is a flowchart illustrating a method for providing a simultaneous write current to bit line write cells using the program method of the non-volatile memory device according to an embodiment of the present invention.

The program method shown in FIG. 9, as previously mentioned in FIG. 3B, may be applied to a non-volatile memory device in which several I/O circuits 220d and 220e are coupled to memory cells through the global bit line GBL and the local bit line LBL.

Referring to FIG. 9, a word line corresponding to bit line write cells can be enabled based on a row address contained in a program address at step S211. For example, the word line receives a row enable signal REN corresponding to a logic low state, thus enabling the word line.

The local bit line LBL coupled to the global bit line GBL can be enabled based on a column address contained in the program address at step S221. In accordance with an embodiment of the present invention, only one of the local bit lines LBLs coupled to the global bit line GBL can be enabled.

The simultaneous write current IDT can be provided to the enabled bit line write cells at step S223.

Figure 10:
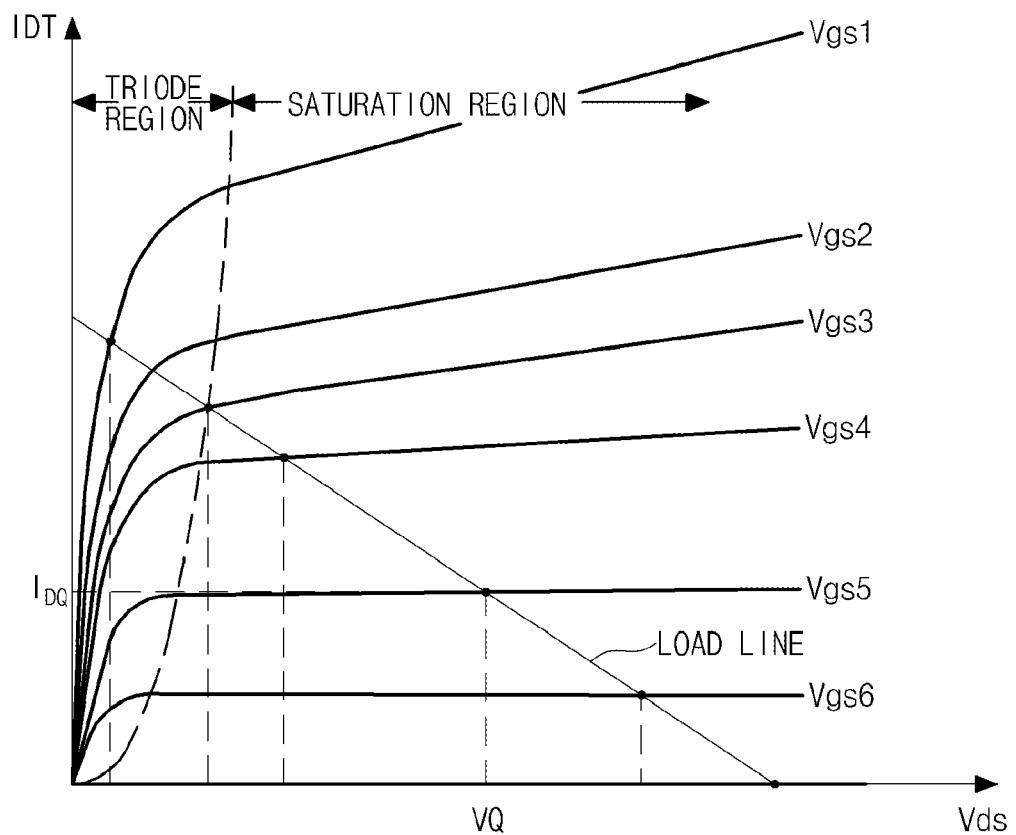
FIG. 10 is a graph illustrating the relationship between a resistance value of each bit line write cell and a simultaneous write current for use in the programming method of the non-volatile memory device according to an embodiment of the present invention.

FIG. 10 is a graph illustrating the relationship between a resistance value of each bit line write cell and the simultaneous write current IDT for use in the programming method of the non-volatile memory device according to an embodiment of the present invention. The graph shown in FIG. 10 is substantially identical to a characteristic graph of a general transistor.

In FIG. 10, an X-axis indicates a drain/source voltage Vds of the second driving transistor TD2 contained in the write current provider 221 shown in FIG. 6. Namely, the X-axis indicates a voltage level between a first terminal and a second terminal of the second driving transistor TD2. A Y-axis indicates a current level of the simultaneous write current IDT provided to the bit line BL.

Since the second driving transistor TD2 is required to be operated in a saturation region to provide the simultaneous write current IDT substantially identical to the write current Iwr, it is necessary for the second driving transistor TD2 to be operated in the saturation region shown in FIG. 10. The slope of a load line may be denoted by an inverse value of a resistance value of the bit line write cells as necessary. However, the scope or spirit of the present invention is not limited only to the load line shown in FIG. 10 and other load lines may also be applied to the present invention as necessary.

The simultaneous write current IDT may be determined according to the relationship between the load line and gate/source voltages Vgs1, Vgs2, Vgs3, Vgs4, Vgs5, and Vgs6 of the second driving transistor TD2. For example, when the drain/source voltage Vds is identical to a voltage of VQ, the simultaneous write current IDT may be determined to be a current of $I_{DQ}$.

Figure 11:
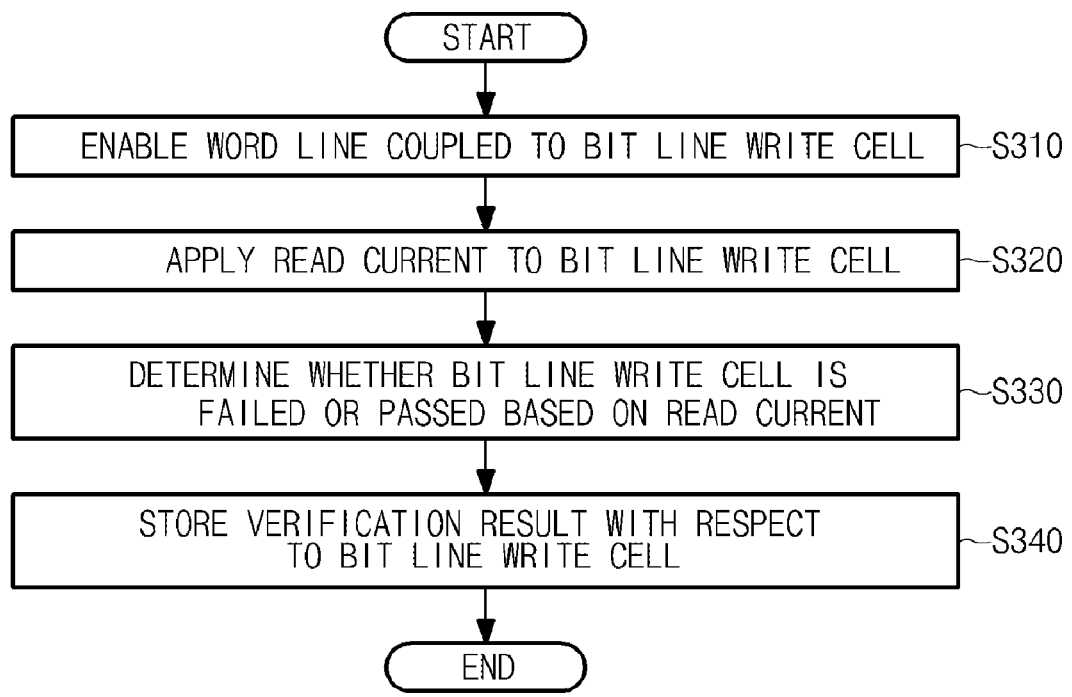
FIG. 11 is a flowchart illustrating a method for sequentially verifying respective bit line write cells according to an embodiment of the present invention.

FIG. 11 is a flowchart illustrating a method for sequentially verifying respective bit line write cells according to an embodiment of the present invention.

Referring to FIG. 11, a word line coupled to bit line write cells can be enabled at step S310. The enabling of the word line coupled to the bit line write cells may be substantially identical to a method for enabling the above-mentioned write partition. However, in the case of the verification operation, as opposed to several write partitions being simultaneously enabled, only one write partition is enabled, so that individual bit line write cells are sequentially enabled. In accordance with an embodiment of the present invention, prior to enabling the bit line write cells, the bit line may be precharged with the same voltage.

The sensing unit 224 shown in FIG. 5 provides the read current Isense to the bit line write cell at step S320. When the bit line is precharged with a voltage having a constant value before the read current Isense is applied to the bit line write cell, the bit line voltage may be changed according to a resistance value of the bit line write cell because the read current Isense flows in the bit line write cell.

The verification unit 225 can determine whether the bit line write cell has failed or not based on the bit line voltage changed according to the read current Isense at step S330. For example, the bit line voltage is sensed and compared with a predetermined reference voltage, and the sense output voltage SOUT is compared with the write data WDT such that it is determined whether the sense output voltage SOUT is identical to the write data WDT.

The verification operation may be sequentially performed in individual bit line write cells, the pass or fail state of each bit line write cell is passed along in the verification result data VRF which may be stored in the verification storage unit 226 at step S340.

Figure 12:
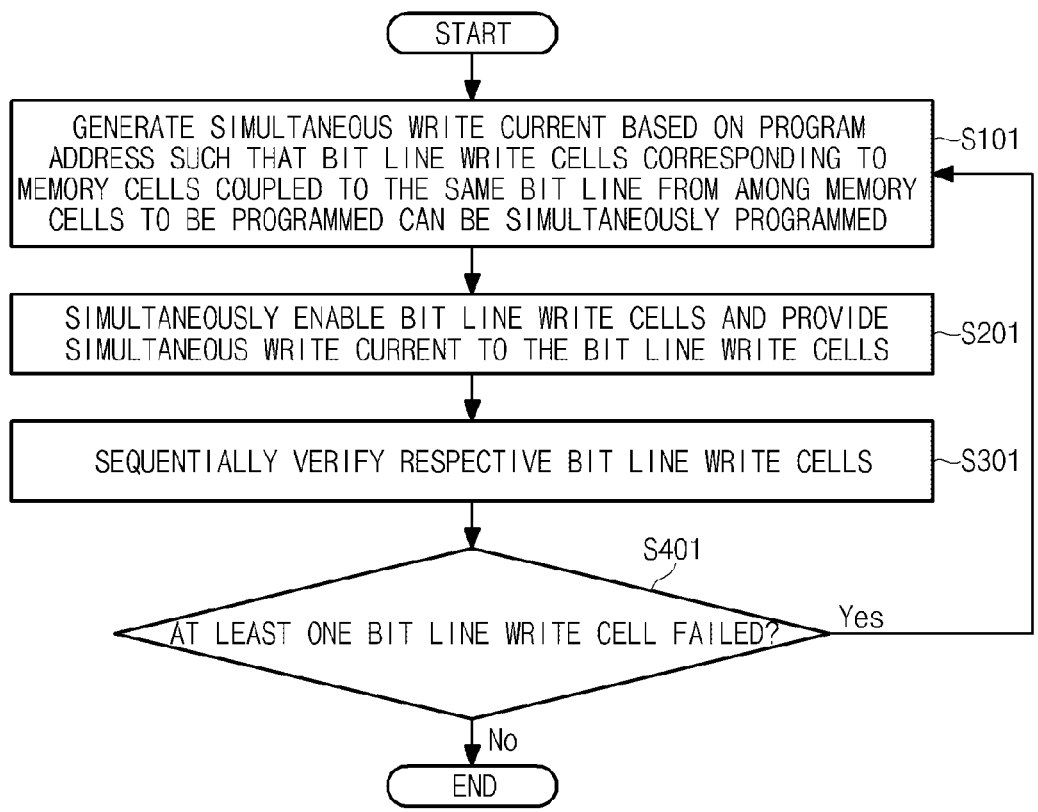
FIG. 12 is a flowchart illustrating a method for programming a non-volatile memory device according to another embodiment of the present invention.

FIG. 12 is a flowchart illustrating a method for programming a non-volatile memory device according to an embodiment of the present invention.

Referring to FIG. 12, the simultaneous write current for the bit line write cells is generated based on the program address at step S101. The bit line write cells may be memory cells coupled to either the global bit line GBL or the local bit line LBL.

The bit line write cells are simultaneously enabled, and the simultaneous write current is provided to the bit line write cells at step S201. The bit line write cells are enabled by the word line WL. In accordance with an embodiment of the present invention, the column selection switches 130a and 130b are enabled to provide the simultaneous write current to the bit line write cells.

The read current is applied to the bit line write cells each storing data such that the verification operation of the bit line write cells is sequentially carried out at step S301.

When it is determined that at least one of the verified bit line write cells has failed at step S401, data is rewritten in the failed memory cells. The verification unit 225 shown in FIG. 5 determines whether the bit line memory cells have passed or failed, and then stores the verification result data VRF in the verification storage unit 226. If it is determined that at least one bit line write cell has failed based on the verification result data VRF, repeated attempts may be made to write data in the failed memory cells.

If it is determined that all the bit line write cells have passed after the repeated data writing operation at step S401, the program operation is completed.

The program method for use in the non-volatile memory device according to one embodiment of the present invention uses resistive memory cells which are coupled to bit lines and word lines. The currents used in the program operation are determined in response to written data and a simultaneous write current is generated by which data can be simultaneously written in the bit line write cells coupled to the same bit line, such that a time required for the program operation can be minimized.

In addition, the program method for use in the non-volatile memory device according to one embodiment of the present invention can generate a simultaneous write current based on not only a resistance value of each bit line write cell in which data is to be written but also a saturation state of the driving transistor, resulting in increased accuracy of the data during a program operation.

As apparent from the above description, the above-mentioned embodiments of the present invention have the following characteristics. First, the programming method for the non-volatile memory device can simultaneously program a plurality of memory cells coupled to the same bit line, resulting in a reduction in programming time.

In addition, the programming method for the non-volatile memory device according to the embodiments of the present invention calculates individual resistance values of several bit line write cells in which data is simultaneously written, generates and provides a simultaneous write current, and thus increases the programming accuracy of each memory cell.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A method for programming a non-volatile memory device, the method comprising:
    generating a simultaneous write current for bit line write cells based on a program address, wherein the bit line write cells correspond to memory cells coupled to the same bit line from among memory cells to be programmed based on the program address; and
    providing the simultaneous write current to the bit line write cells by simultaneously enabling the bit line write cells,
    wherein the generating of the simultaneous write current includes:
        generating a write current control signal based on the program address; and
        generating the simultaneous write current based on the write current control signal.

2. The method according to claim 1, wherein the generating of the simultaneous write current includes:
    generating the simultaneous write current based on the number of bit line write cells.

3. The method according to claim 1, wherein the memory cells include resistive memory cells.

4. The method according to claim 3, wherein the generating of the simultaneous write current includes:
    generating the simultaneous write current based on resistance values of the bit line write cells.

5. The method according to claim 1, wherein the generating of the write current control signal includes:
    calculating resistance values of the bit line write cells.

6. The method according to claim 1, further comprising sequentially verifying the bit line write cells.

7. The method according to claim 6, wherein the sequential verifying of the bit line write cells includes:
    enabling word lines coupled to the bit line write cells;
    applying a read current to the bit line write cells; and
    comparing a bit line voltage corresponding to the bit line write cells with a reference voltage to determine whether the bit line write cells are passed or failed, and generating verification data.

8. The method according to claim 7, wherein the sequential verifying of the bit line write cells further comprises storing the verification data.

9. The method according to claim 7, wherein the sequential verifying of the bit line write cells further comprises:
    when at least one bit line write cell is determined to be failed, generating a simultaneous write current in such a manner that the failed bit line write cells are simultaneously programmed; and
    simultaneously enabling write partitions including the failed bit line write cells, thereby providing the simultaneous write current to the failed bit line write cells.

10. A method for programming a non-volatile memory device, the method comprising:
    calculating resistance values of bit line write cells based on a program address, wherein the bit line write cells correspond to memory cells coupled to the same global bit line from among memory cells to be programmed based on the program address;
    generating a simultaneous write current for programming the bit line write cells based on the calculated resistance values; and
    providing the simultaneous write current to the bit line write cells by simultaneously enabling the bit line write cells,
    wherein the generating of the simultaneous write current includes:
        generating the simultaneous write current based on the calculated resistance values and a saturation current condition of a driving transistor that provides the simultaneous write current to the same global bit line.

11. The method according to claim 10, wherein the generating of the simultaneous write current includes:
    switching a plurality of constant current sources in such a manner that the constant current sources are coupled to the global bit line based on the calculated resistance values and the saturation current condition.

12. The method according to claim 10, further comprising:
    sequentially enabling the bit line write cells to verify the bit line write cells.

13. The method according to claim 12, wherein the verifying of the bit line write cells includes:
    sequentially applying a read current to the bit line write cells, and sensing a voltage of the global bit line;

generating a sense output signal by comparing the sensed global bit line voltage with a reference voltage; and comparing the sense output signal with data to be programmed in the bit line write cells, and generating verification data.

14. The method according to claim 13, wherein the verifying of the bit line write cells further comprises storing the verification data.

15. The method according to claim 13, wherein the verifying of the bit line write cells further comprises:

upon determining that at least one of the bit line write cells is failed based on the verification data, generating a simultaneous write current for the failed bit line write cell, and performing a program operation on the failed bit line write cell.

16. The method according to claim 10, wherein the memory cell includes any of a phase change memory cell, a magnetic memory cell, and a resistive memory cell.

17. The method according to claim 10, wherein the calculating of the resistance values of the bit line write cells includes:

determining a limit value of the simultaneous write current based on a driving voltage generating the simultaneous write current.

18. A method for programming a non-volatile memory device including a non-volatile memory cell array that includes a plurality of bit lines and a plurality of word lines, the method comprising:

calculating resistance values of bit line write cells corresponding to memory cells that are to be programmed and coupled to a single bit line from among the plurality of bit lines;

generating a write current control signal based on the calculated resistance values;

generating a simultaneous write current based on the write current control signal and a driving voltage; and enabling word lines coupled to the bit line write cells, and providing the simultaneous write current to the bit line write cells.

19. A non-volatile memory device comprising:

a controller configured to generate a program address and an input/output (I/O) control signal by communicating with an external part;

a memory cell array including a plurality of memory cells each of which is coupled to one of a plurality of bit lines and one of a plurality of word lines, wherein accessing of the memory cells is achieved based on the program address;

an input/output (I/O) unit including input/output (I/O) circuits and configured to generate a simultaneous write current to simultaneously perform a program operation, based on the program address, on bit line cells corresponding to memory cells coupled to one of the bit lines; and a row decoder coupled to the word lines of the memory cell array, and configured to enable write partitions including the bit line write cells in such a manner that the simultaneous write current is provided to the bit line cells based on the program address, wherein each of the I/O circuits includes:

a write controller configured to identify the bit line write cells based on the I/O control signal, and generate a current control signal;

a write current generator configured to generate the simultaneous write current to be provided to the bit line cells based on the current control signal; and a write current provider configured to provide the simultaneous write current to the bit line cells.

20. The non-volatile memory device according to claim 19, wherein the write current generator includes a plurality of constant current sources that are operated in response to the current control signal.

21. The non-volatile memory device according to claim 20, wherein the constant current sources generate write currents that are substantially equal to each other, or generate write currents having values that increase exponentially.

22. The non-volatile memory device according to claim 19, wherein the write current provider includes:

a first driving transistor coupled between a step-up voltage and the write current generator; and a second driving transistor coupled between the step-up voltage and a corresponding bit line, and configured to be coupled to the first driving transistor in the form of a current mirror.

23. The non-volatile memory device according to claim 22, wherein the write controller generates the current control signal based on the I/O control signal, resistance values of the bit line write cells, and a saturation state of the second driving transistor.

* * * * *